US012568608B2

(12) United States Patent
Han et al.

(10) Patent No.: US 12,568,608 B2
(45) Date of Patent: Mar. 3, 2026

(54) NON-POWER COOLING DEVICE FOR UNDERWATER DATACENTER

(71) Applicant: Korea Institute of Ocean Science & Technology, Busan (KR)

(72) Inventors: Taek Hee Han, Busan (KR); Seokjae Lee, Busan (KR)

(73) Assignee: Korea Institute of Ocean Science & Technology, Busan (KR)

( * ) Notice: Subject to any disclaimer, the term of this patent is extended or adjusted under 35 U.S.C. 154(b) by 292 days.

(21) Appl. No.: 18/345,180

(22) Filed: Jun. 30, 2023

(65) Prior Publication Data

US 2024/0284638 A1 Aug. 22, 2024

(30) Foreign Application Priority Data

Feb. 20, 2023 (KR) ........................ 10-2023-0022037

(51) Int. Cl.
H05K 7/20 (2006.01)

(52) U.S. Cl.
CPC ................................ H05K 7/20763 (2013.01)

(58) Field of Classification Search
CPC ............. H05K 7/20763; H05K 7/2079; H05K 7/20236; H05K 7/20781; F28D 1/04; F28D 7/00; F28D 1/022; B63C 11/52
See application file for complete search history.

(56) References Cited

U.S. PATENT DOCUMENTS

| | | | |
|---|---|---|---|
| 2021/0267096 A1* | 8/2021 | Heydari | H05K 7/20254 |
| 2022/0225545 A1* | 7/2022 | Heydari | H05K 7/20736 |
| 2022/0264764 A1* | 8/2022 | Heydari | H05K 7/20254 |
| 2024/0040752 A1* | 2/2024 | Oh | H05K 7/20763 |

FOREIGN PATENT DOCUMENTS

| | | | | |
|---|---|---|---|---|
| GB | 2603571 A | * | 8/2022 | H05K 7/20236 |
| GB | 2606821 A | * | 11/2022 | H05K 7/2079 |

* cited by examiner

*Primary Examiner* — Jon T. Schermerhorn, Jr.
(74) *Attorney, Agent, or Firm* — Bridgeway IP Law Group, PLLC; Jihun Kim

(57) ABSTRACT

Proposed is a cooling device for an underwater datacenter, which is adapted to perform heat exchange between internal devices of the underwater datacenter and seawater, the cooling device including, an inlet duct located on one surface of the underwater datacenter and having a seawater introducing passage formed therealong and outlet ducts located spaced apart from the inlet duct and having seawater discharging passages formed therealong.

5 Claims, 12 Drawing Sheets

S

S

NON-POWER COOLING DEVICE FOR UNDERWATER DATACENTER

CROSS REFERENCE TO RELATED APPLICATION OF THE INVENTION

The present application claims the benefit of Korean Patent Application No. 10-2023-0022037 filed in the Korean Intellectual Property Office on Feb. 20, 2023. the entire contents of which are incorporated herein by reference.

BACKGROUND OF THE INVENTION

Field of the Invention

The present invention relates to a cooling device for an underwater datacenter located on the bottom of the sea.

Background of the Related Art

Generally, a datacenter is a building or a facility in the building that integrates hardware components relating to internet such as servers, switches, storages, network systems, lines, and the like to one place and thus manages them.

At present, about 38% of the total power consumed in the datacenter is used by a cooling system for cooling internal devices in the datacenter.

An underwater datacenter is built on the bottom of the sea at which given temperature and humidity are kept, so that the amount of power assigned to cooling and maintenance systems can be reduced.

To additionally reduce the energy consumed in the underwater datacenter, it is important that heat exchange between seawater and the underwater datacenter is gently induced.

Accordingly, there is a need to develop a non-power cooling device that is designed to have outer appearance and internal shape capable of optimizing the heat exchange between seawater and the underwater datacenter through natural flow of the seawater.

SUMMARY OF THE INVENTION

Accordingly, the present invention has been made in view of the above-mentioned problems occurring in the related art, and it is an object of the present invention to provide a non-power cooling device for an underwater datacenter that is capable of optimizing heat exchange between seawater and the underwater datacenter through natural flow of the seawater.

Technical objects to be achieved by the present disclosure are not limited to the aforementioned technical objects, and other technical objects not described above may be evidently understood by a person having ordinary skill in the art to which the present disclosure pertains from the following description.

In accordance with an aspect of the present disclosure, there is provided a cooling device for an underwater datacenter, which is adapted to perform heat exchange between internal devices of the underwater datacenter and seawater, the cooling device including, an inlet duct located on one surface of the underwater datacenter and having a seawater introducing passage formed therealong and outlet ducts located spaced apart from the inlet duct and having seawater discharging passages formed therealong.

In accordance with an aspect of the present disclosure, there is provided a cooling device for an underwater datacenter, which is adapted to perform heat exchange between internal devices of the underwater datacenter and seawater, the cooling device including, an inlet duct located rotatably on one surface of the underwater datacenter and having a seawater introducing passage formed therealong and outlet ducts located spaced apart from the inlet duct and having seawater discharging passages formed therealong.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE PREFERRED EMBODIMENTS

Figure 1:
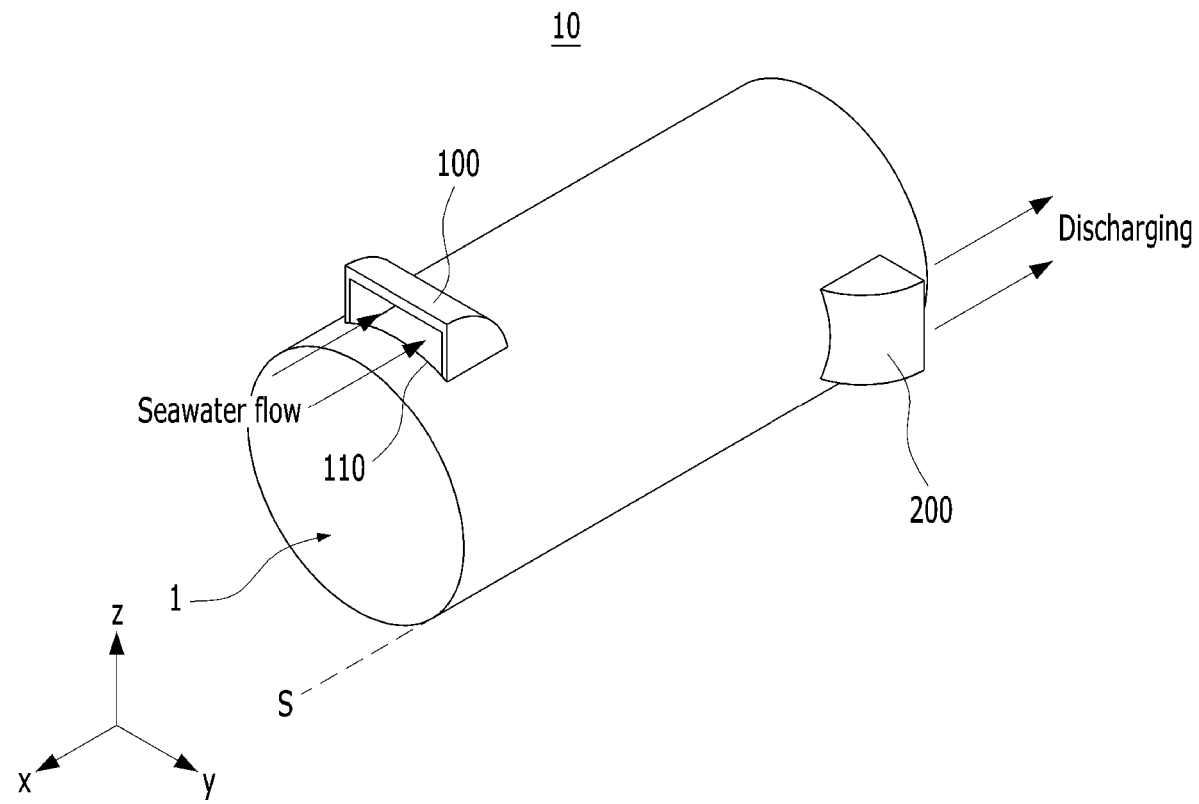
FIG. 1 is a perspective view showing a non-power cooling device for an underwater datacenter according to an embodiment of the present invention.

Hereinafter, the present invention will be described with reference to the accompanying drawings. However, the present invention may be implemented in several different forms, and thus is not limited to the embodiments described herein. In addition, in order to clearly explain the present invention in the drawings, parts unrelated to the description are omitted, and similar reference numerals are attached to similar parts throughout the specification.

Throughout the specification, when a part is "linked (connected, contacted, coupled)" to another part, it includes the cases of being "indirectly connected" with intervention of another member therebetween, as well as the cases of being "directly connected". In addition, when a part "includes" a certain component, this means that other components may be further provided rather than excluding other components unless clearly stated otherwise.

The terms used in this specification are used only to describe specific embodiments, and are not intended to limit the present invention. Singular expressions include plural expressions unless the context clearly dictates otherwise. It should be understood that in the present specification, terms such as "comprise" or "have" are intended to specify existence of a feature, number, step, operation, component, part, or combination thereof described in the specification, not to preclude the possibility of existence or addition of one or more other features, numbers, steps, operations, components, parts, or combinations thereof.

The present invention relates to a non-power cooling device for an underwater datacenter.

FIG. 1 is a perspective view showing a non-power cooling device for an underwater datacenter according to an embodiment of the present invention.

Referring to FIG. 1, a non-power cooling device 10 for an underwater datacenter 1 according to an embodiment of the present invention includes an inlet duct 100 and outlet ducts 200.

The non-power cooling device 10 for the underwater datacenter 1 according to the present invention serves to perform heat exchange between internal devices 2 of the underwater datacenter 1 and seawater.

Around the underwater datacenter 1 located on the bottom of the sea, a flow of seawater is generated in a given direction throughout the year because of an ocean current.

The non-power cooling device 10 for the underwater datacenter 1 according to the present invention is designed to allow seawater to move along the outer surfaces of the internal devices 2 of the underwater datacenter 1 according to the flow of the seawater and thus cool the internal devices 2.

The inlet duct 100 is located on one surface of the underwater datacenter 1 and has a passage formed thereon to introduce the seawater therealong from the sea.

According to the present invention, before the inlet duct 100 is designed, a direction along which the seawater flows is pre-observed on a position where the non-power cooling device 10 for the underwater datacenter 1 is located by a user, and next, a portion into which the seawater is introduced is first determined. As a result, the inlet duct 100 is appropriately designed in consideration of the determined portion for introducing the seawater.

The outlet ducts 200 are located spaced apart from the inlet duct 100 and have passages formed therealong to discharge the seawater of a heat exchanger 300 to the sea.

As shown in FIG. 1, the inlet duct 100 is located above the outlet ducts 200 with respect to the bottom of the sea S on which the underwater datacenter is located.

The flow of seawater caused by the ocean current is present around the underwater datacenter 1, but a difference between the potential heads of the inlet duct 100 and the outlet ducts 200 is needed to induce a gentle flow of the seawater among the inlet duct 100, the outlet ducts 200, and a cooling pipe line of the heat exchanger 300 as will be discussed later. To do this, the inlet duct 100 is higher in position than the outlet ducts 200.

Figure 4:
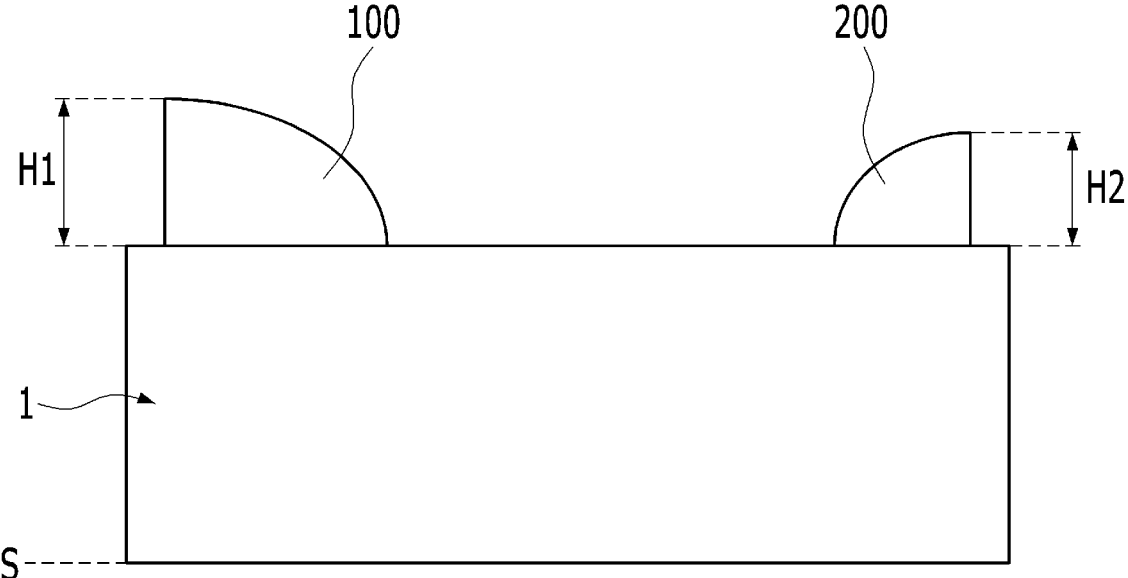
FIG. 4 is an exemplary view showing an inlet duct and an outlet duct that are mounted on a non-power cooling device for an underwater datacenter according to another embodiment of the present invention.

Further, as shown in FIG. 4, a height of the inlet duct 100 is greater than a height of each outlet duct 200 (H1>H2), thereby increasing a speed of the seawater discharged.

Figure 2:
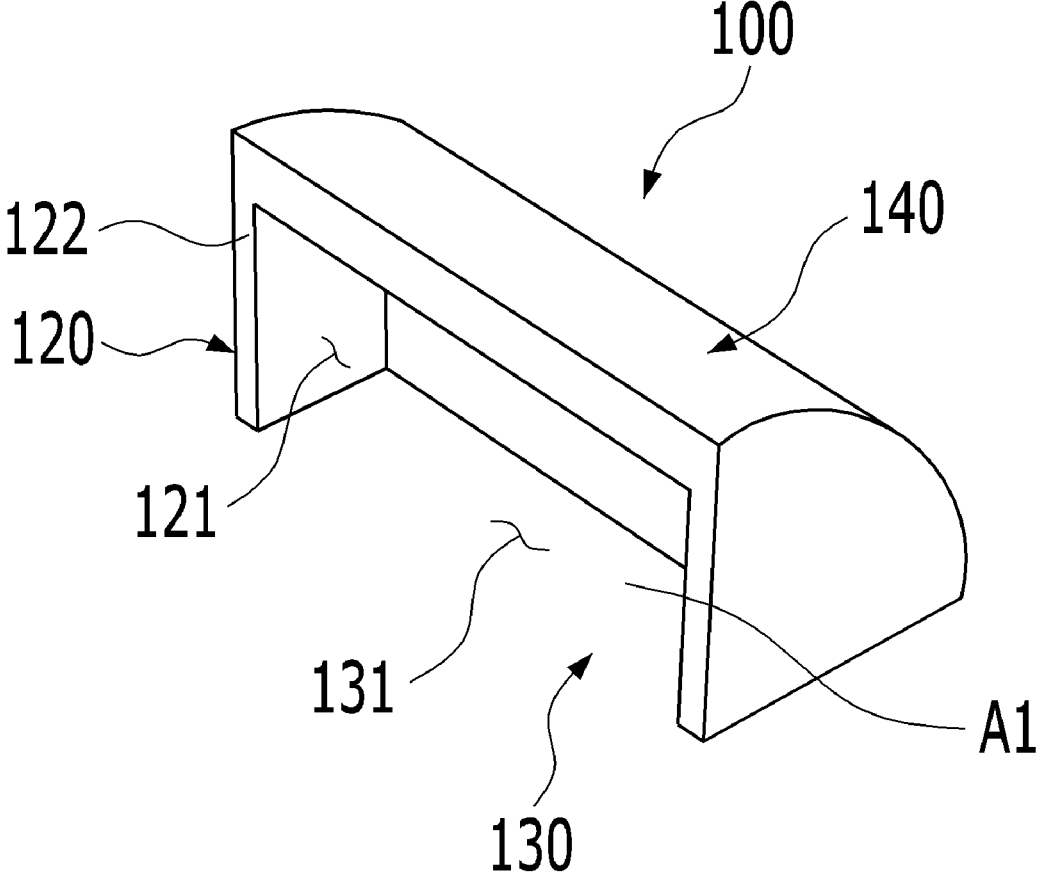
FIGS. 2 and 3 are perspective views showing an inlet duct and an outlet duct of the non-power cooling device for the underwater datacenter according to the present invention.
Figure 3:
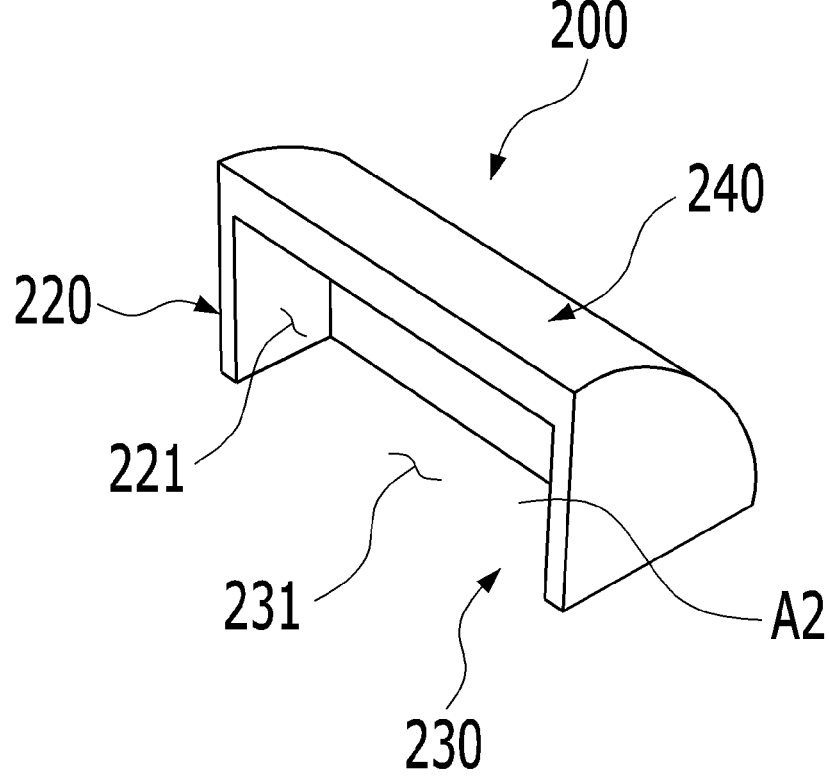

FIGS. 2 and 3 are perspective views showing the inlet duct and the outlet duct of the non-power cooling device for the underwater datacenter according to the present invention.

FIG. 2 shows the inlet duct of the non-power cooling device for the underwater datacenter according to the present invention, and FIG. 3 shows the outlet duct of the non-power cooling device for the underwater datacenter according to the present invention.

Referring to FIG. 2, the inlet duct 100 of the non-power cooling device 10 for the underwater datacenter 1 according to the present invention includes a seawater introducing part 120, an inlet duct connection part 130, and an introduction passage part 140.

The seawater introducing part 120 has an inlet 121 open to introduce the seawater thereinto.

Further, the seawater introducing part 120 has a rectangular frame 122 adapted to form the open inlet 121.

According to one embodiment of the present invention, the inlet 121 has the shape of a rectangle, but it may be freely formed to a shape capable of introducing the seawater, without being limited thereto.

The inlet duct connection part 130 is configured to have at least a portion coming into close contact with the outer surface of the underwater datacenter 1 and an open portion 131 formed on the bottom thereof to move the seawater from the inlet duct 100 to the heat exchanger 300.

In this case, the open portion 131 formed on the bottom of the inlet duct connection part 130 communicates with the space of the heat exchanger 300.

The introduction passage part 140 connects the seawater introducing part 120 and the inlet duct connection part 130 to each other and provides a passage with a curved outer surface.

Through the introduction passage part 140, the seawater in the inlet duct 100 moves to the heat exchanger 300 according to the flow of seawater.

Referring to FIG. 3, the outlet duct 200 of the non-power cooling device 10 for the underwater datacenter 1 according to the present invention includes a seawater discharging part 220, an outlet duct connection part 230, and a discharge passage part 240.

The seawater discharging part 220 has an outlet 221 open to discharge the seawater from the heat exchanger 300 to the sea.

Further, the seawater discharging part 220 has a rectangular frame adapted to form the open outlet 221.

According to one embodiment of the present invention, the outlet 221 has the shape of a rectangle, but it may be freely formed to a shape capable of discharging the seawater, without being limited thereto.

The outlet duct connection part 230 is configured to have at least a portion coming into close contact with the outer surface of the underwater datacenter 1 and an open portion 231 formed on the bottom thereof to move the seawater from the heat exchanger 300.

In this case, the open portion 231 formed on the bottom of the outlet duct connection part 230 communicates with the heat exchanger 300.

The discharge passage part 240 connects the seawater discharging part 220 and the outlet duct connection part 230 to each other and provides a passage with a curved outer surface.

Through the discharge passage part 240, the seawater in the heat exchanger 300 moves to the outside from the heat exchanger 300 according to the flow of seawater.

Further, as shown in FIG. 2, an area A1 of the inlet 121 is greater than an area A2 of the outlet 221, thereby increasing the speed of seawater discharged.

FIG. 4 is an exemplary view showing an inlet duct and an outlet duct that are mounted on a non-power cooling device for an underwater datacenter according to another embodiment of the present invention.

The non-power cooling device for an underwater datacenter 1 according to another embodiment of the present invention is configured to have an inlet duct 100 and an outlet duct 200 located on top of the outer surface of the underwater datacenter 1.

In this case, a height H1 of the inlet duct 100 is greater than a height H2 of the outlet duct 200, thereby increasing the speed of seawater discharged.

Figure 5:
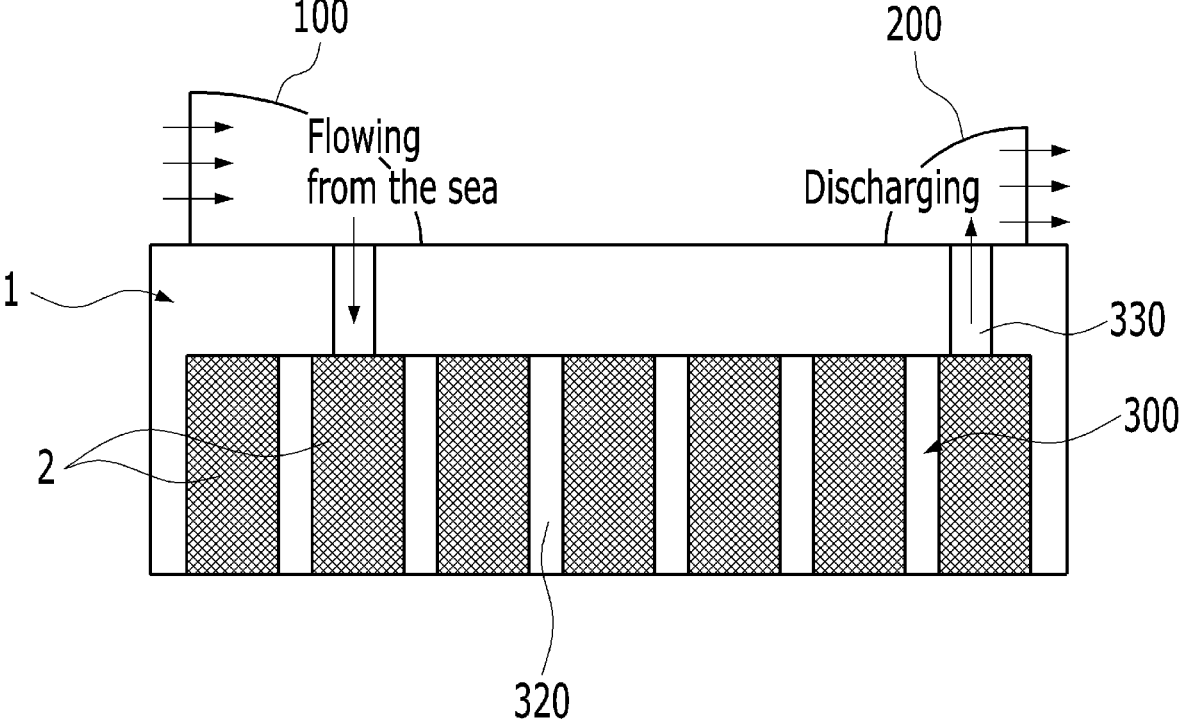
FIG. 5 is a sectional view showing a heat exchanger of the non-power cooling device for the underwater datacenter according to the present invention.

FIG. 5 is a sectional view showing the heat exchanger of the non-power cooling device for the underwater datacenter according to the present invention.

Referring to FIG. 5, the non-power cooling device 10 for the underwater datacenter 1 according to the present invention includes the heat exchanger 300.

The heat exchanger 300 is configured to allow one side to be connected to the inlet duct 100 and the other side to be connected to the outlet duct 200, while surrounding the outer surfaces of the internal devices 2 of the underwater datacenter 1.

According to the present invention, the heat exchanger 300 has a plurality of hollow pipes.

In specific, the heat exchanger 300 includes an introduction pipe 310 connected to the inlet duct 100, heat exchange pipes 320 adapted to surround the outer surfaces of the internal devices 2, and a discharge pipe 330 connected to the outlet duct 200.

The non-power cooling device 10 for the underwater datacenter 1 according to the present invention is configured to allow the seawater introduced thereinto to have the heat exchange with the internal devices 2 of the underwater datacenter 1 through the heat exchange pipes 320.

Figure 6:
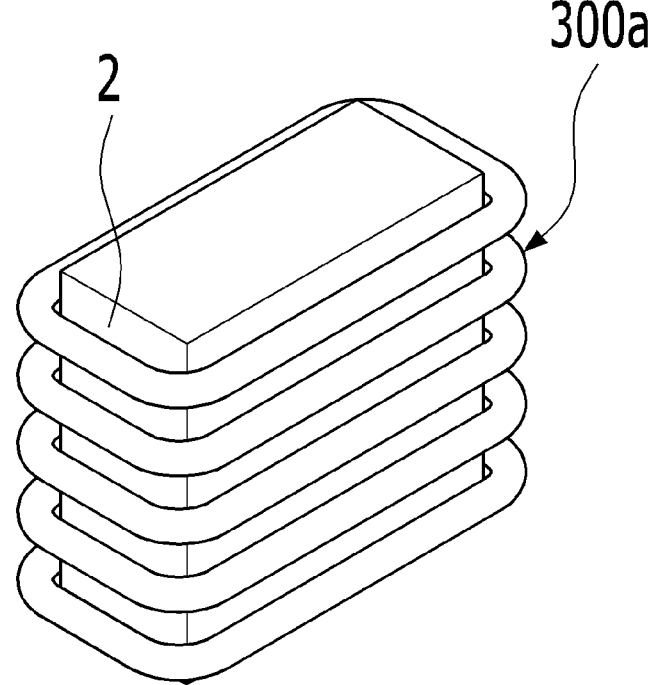
FIGS. 6 to 8 are perspective views showing various installation examples of the heat exchanger of the non-power cooling device for the underwater datacenter according to the present invention.
Figure 7:
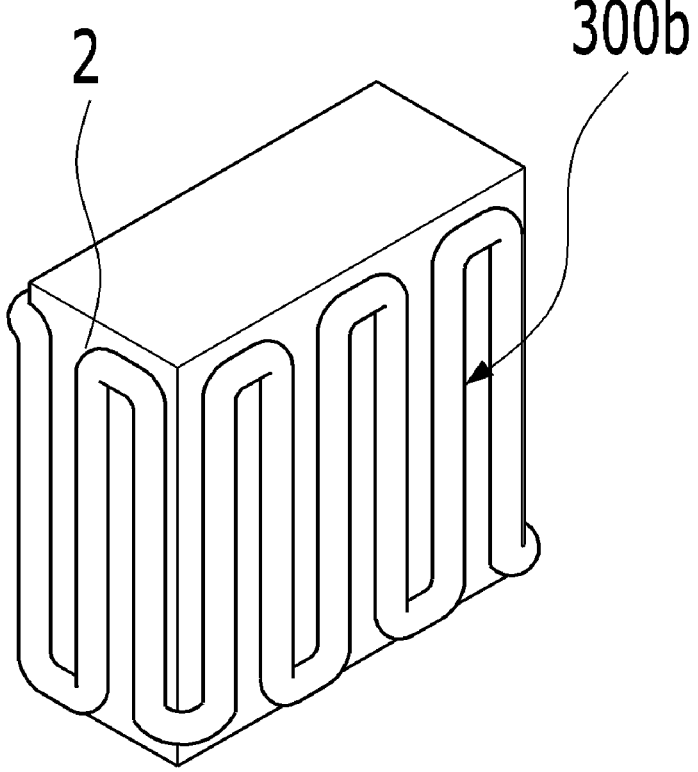
Figure 8:
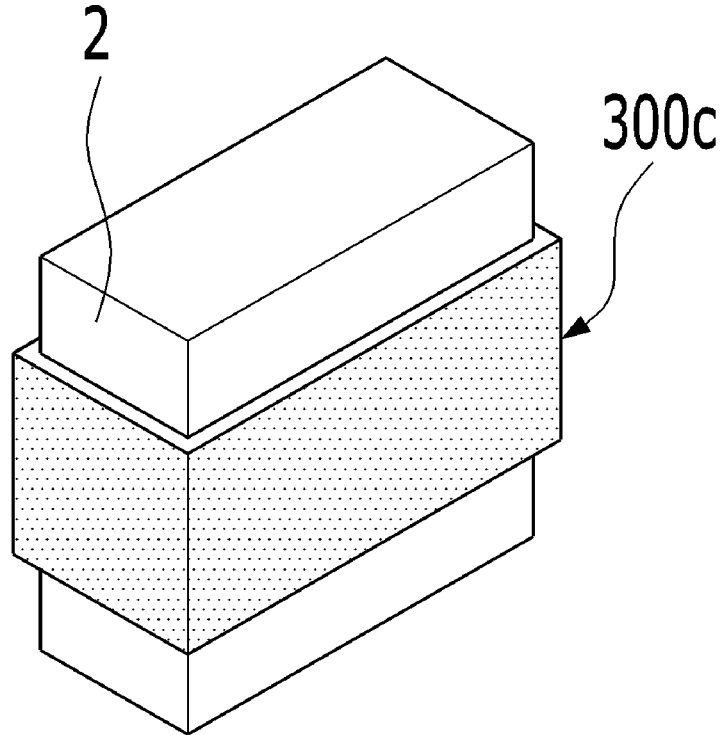

FIGS. 6 to 8 are perspective views showing various installation examples of the heat exchanger of the non-power cooling device for the underwater datacenter according to the present invention.

According to various embodiments of the present invention, the heat exchanger 300 of the non-power cooling device 10 for the underwater datacenter 1 may have a pipe or panel type heat exchanger in accordance with the amount of cooling required.

FIGS. 6 and 7 show examples where the pipe type heat exchanger 300 is mounted on the internal device 2, and FIG. 8 shows an example where the panel type heat exchanger 300 is mounted on the internal device 2.

As shown in FIG. 6, a pipe 300*a* of the heat exchanger 300 is located horizontally, and contrarily, as shown in FIG. 7, a pipe 300*b* of the heat exchanger 300 is located vertically.

If the pipe type heat exchanger 300 is installed, it includes the introduction pipe 310 connected to the inlet duct 100 and the discharge pipe 330 connected to the outlet duct 200.

Further, as shown in FIG. 8, if the heat exchanger 300 is mounted to the form of a panel 300*c*, it has the introduction pipe 310 connected to the inlet duct 100 and the discharge pipe 330 connected to the outlet ducts 200, which are located on both sides of the panel 300*c*, to thus introduce and discharge the seawater.

According to various embodiments of the present invention, the pipe or panel is provided to allow at least a portion thereof to have surface contact with the internal device 2, so that the heat of the internal device 2 is transferred effectively to the heat exchanger 300, thereby cooling the internal device 2.

Figure 9:
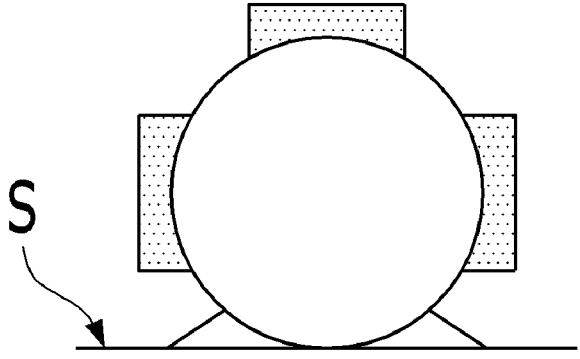
FIGS. 9 to 12 are sectional views showing various installation examples of the inlet ducts and the outlet ducts of the non-power cooling device for the underwater datacenter according to the present invention.
Figure 10:
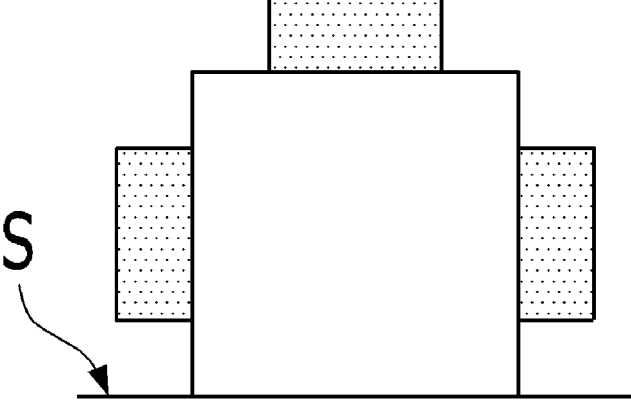
Figure 11:
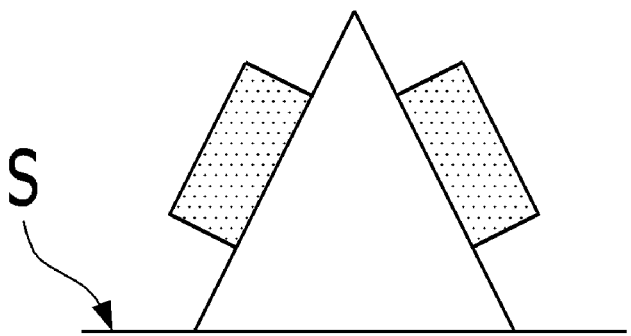

FIGS. 9 to 11 show various installation examples of the inlet ducts and the outlet ducts of the non-power cooling device 10 for the underwater datacenter 1 according to the present invention.

As shown in FIG. 9, the inlet ducts 100 and the outlet ducts 200 are attachable to a plurality of positions on the outer peripheral surface of the underwater datacenter 1 in accordance with the amount of cooling required, excepting the underside of the underwater datacenter 1 coming into contact with the bottom of the sea S on which the underwater datacenter 1 is installed.

FIG. 9 shows an example where the underwater datacenter 1 has a circular sectional shape, and in this case, the inlet ducts 100 and the outlet ducts 200 are attachable to the plurality of positions on the outer peripheral surface of the underwater datacenter 1 excepting the underside of the underwater datacenter 1 coming into contact with the bottom of the sea S.

In specific, the inlet ducts 100 are attached to the uppermost end of the underwater datacenter 1, and the outlet ducts 200 to the lower end of the underwater datacenter 1. Otherwise, the inlet ducts 100 are attached to the upper and lower ends of the underwater datacenter 1, and the outlet ducts 200 to the same lines as the inlet ducts 100.

Even if the underwater datacenter 1 is changed from the cylindrical shape to other shapes, the inlet ducts 100 and the outlet ducts 200 for circulating the seawater are attached to respective surfaces of the underwater datacenter 1, as shown in FIGS. 10 and 11.

FIG. 10 shows an example where the underwater datacenter 1 has a square sectional shape, and in this case, the inlet ducts 100 and the outlet ducts 200 are attachable to the plurality of positions on the outer surfaces of the underwater datacenter 1 excepting the underside of the underwater datacenter 1 coming into contact with the bottom of the sea S.

In specific, the inlet duct 100 is attached to the uppermost end of the underwater datacenter 1, and the outlet ducts 200 to both sides of the underwater datacenter 1. Otherwise, the inlet ducts 100 are attached to top and both sides of the underwater datacenter 1, and the outlet ducts 200 to the same lines as the inlet ducts 100.

FIG. 11 shows an example where the underwater datacenter 1 has a triangular sectional shape, and in this case, the inlet ducts 100 and the outlet ducts 200 are attachable to the plurality of positions on the outer surfaces of the underwater datacenter 1 excepting the underside of the underwater datacenter 1 coming into contact with the bottom of the sea S.

In specific, the inlet ducts 100 are attached to two side surfaces of the triangular underwater datacenter 1, and the outlet ducts 200 to the same lines as the inlet ducts 100.

The number of inlet ducts 100 and outlet ducts 200 installed for seawater circulation and their sizes are freely selected in consideration of the outer shape and cooling efficiency of the underwater datacenter 1, and the shape of the heat exchanger 300 attached to the internal device 2 is determined in consideration of the cooling efficiency required by the underwater datacenter 1 and a construction cost.

Figure 12:
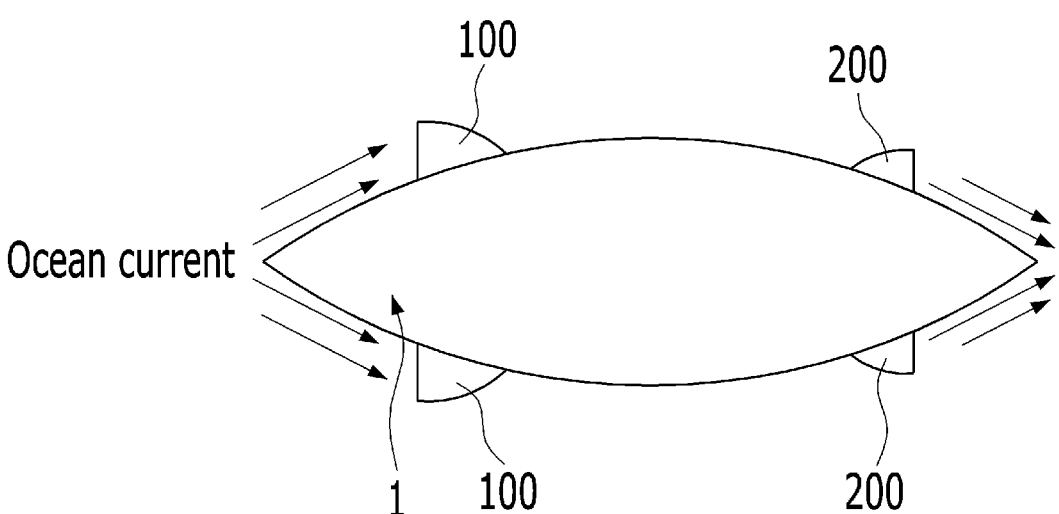

Further, an underwater datacenter having a given structure as shown in FIG. 12 is provided so as to allow the seawater to be gently introduced into the inlet duct 100, without having any interference with the flow of the ocean current on the outside of the underwater datacenter 1.

As shown in FIG. 12, if the underwater datacenter 1 is streamlined, the inlet ducts 100 are attached to top and underside of the underwater datacenter 1 with respect to the central portion of the underwater datacenter 1, and the outlet ducts 200 are attached to the underwater datacenter 1, while spaced apart from the inlet ducts 100.

In this case, one outlet duct 200 is located at a lower height than the corresponding inlet duct 100 attached to top of the underwater datacenter 1, and the other outlet duct 200 at a higher height than the corresponding inlet duct 100 attached to the underside of the underwater datacenter 1.

Figure 13:
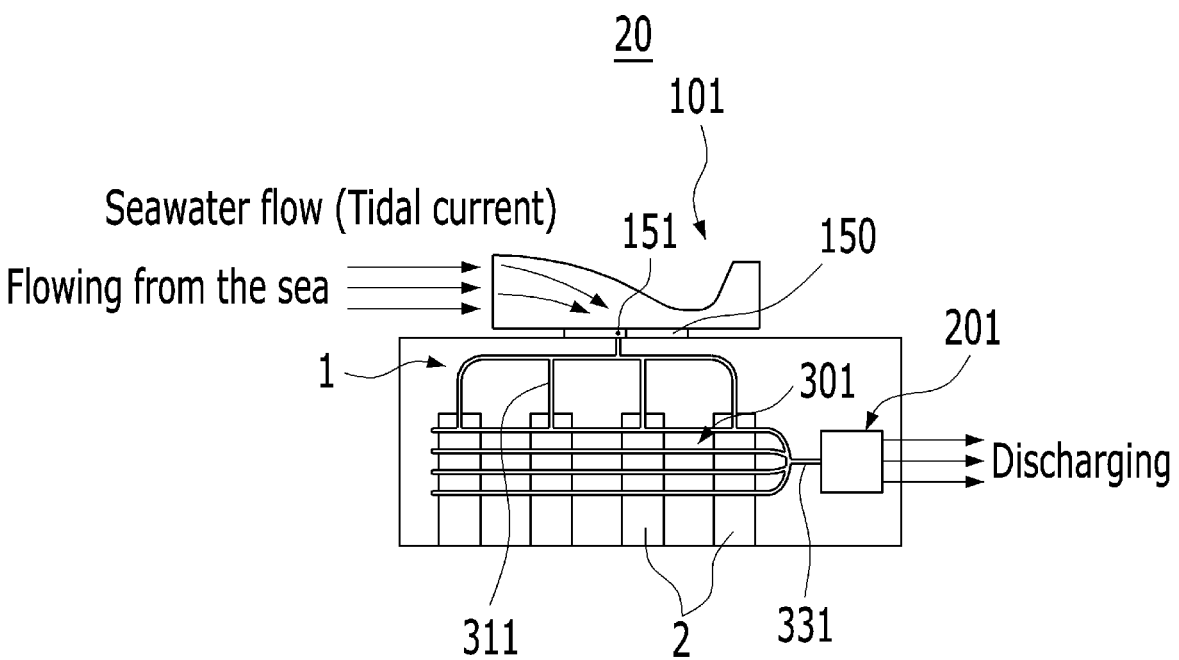
FIGS. 13 and 14 are sectional and perspective views showing an inlet duct of a non-power cooling device for an underwater datacenter according to yet another embodiment of the present invention.
Figure 14:
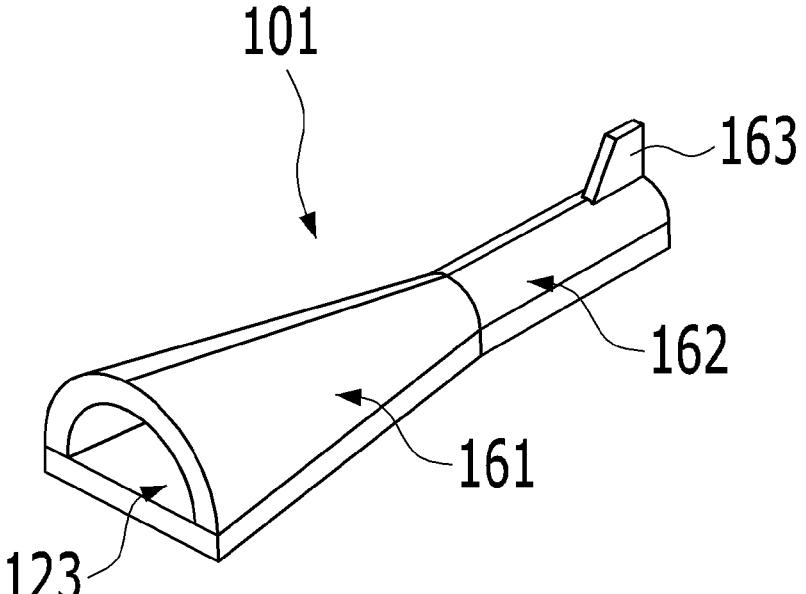

FIGS. 13 and 14 show a non-power cooling device for an underwater datacenter according to yet another embodiment of the present invention and an inlet duct of the non-power cooling device.

If the bottom of the sea on which the underwater datacenter 1 is installed is influenced by tidal currents, a non-power cooling device 20 for an underwater datacenter 1 according to yet another embodiment of the present invention is provided to a given structure as shown in FIG. 13.

The ocean current flows in a given direction, but in the case of tidal currents, their flowing direction rotates according to the changes of time. Further, the tidal currents have constant rotational periods like tidal periods, and accordingly, an inlet duct 101 is designed to minimize the influence of tidal currents.

Referring to FIG. 13, the non-power cooling device 20 for the underwater datacenter 1 according to yet another embodiment of the present invention includes the inlet duct 101 and outlet ducts 201.

The inlet duct 101 is located on one surface of the underwater datacenter 1, has a passage formed thereon to introduce the seawater from the sea, and is rotatably mounted on the underwater datacenter 1.

As shown in FIG. 14, the inlet duct 101 is rotatable and has a seawater inlet 123 adapted to introduce seawater thereinto.

In this case, the inlet 123 has a semicircular sectional shape.

Referring back to FIG. 13, the inlet duct 101 is located on top of the underwater datacenter 1 and has a passage along which the seawater is introduced from the sea.

Referring to FIG. 14, the inlet duct 101 is divided into a front portion 161 and a rear portion 162 with respect to the lengthwise direction of the underwater datacenter 1, and the front portion 161 becomes decreased in height as it goes toward the center portion of the underwater datacenter 1 with respect to the lengthwise direction of the underwater datacenter 1, whereas the rear portion 162 becomes constant or increased in height with respect to the lengthwise direction of the underwater datacenter 1.

Further, the inlet duct 101 has a tail 163 mounted on the rear portion 162 so as to reduce the influence of tidal currents.

Referring back to FIG. 13, the outlet ducts 201 are spaced apart from the inlet duct 101 and have passages along which the seawater is discharged from a heat exchanger 301.

According to another embodiment of the present invention, the outlet ducts 201 are located on the sides of the underwater datacenter 1.

Further, the non-power cooling device 20 for the underwater datacenter 1 according to yet another embodiment of the present invention includes a rotating structure 150 located between the inlet duct 101 and the underwater datacenter 1.

The rotating structure 150 rotates to allow the position of the seawater inlet 123 to rotate based on the directions of tidal currents.

The position of the seawater inlet 123 of the inlet duct 101 automatically rotates through the rotating structure 150 according to the changing directions of tidal currents, and the rotating structure 150 is located on the center of the underwater datacenter 1.

The rotating structure 150 has an open hole 151 formed on the center thereof to allow the seawater to flow between the inlet duct 101 and the heat exchanger 301, and even though the inlet duct 101 rotates, the flow of seawater is not stopped by means of the open hole 151.

According to yet another embodiment of the present invention, the heat exchanger 301 is connected to the inlet duct 101 on one side thereof and to the outlet duct 201 on the other side thereof, while surrounding the outer surfaces of internal devices 2 of the underwater datacenter 1.

The heat exchanger 301 includes a plurality of cooling pipes 311 connected to the inlet duct 101 by means of the open hole 151 and thus branched to the internal devices 2. Further, the heat exchanger 301 includes discharge pipes 331 connected to the outlet pipes 331.

The seawater whose heat exchange is finished in the heat exchanger 301 is discharged to the sides or bottom of the underwater datacenter 1 according to its flow.

According to various embodiments of the present invention, the heat exchanger 301, which improves the cooling performance of the underwater datacenter 1, has a shorter heat transfer distance between the seawater and the internal devices than the heat exchanger of the general underwater datacenter, thereby being advantageous in emitting the heat generated from the interior of the underwater datacenter to the outside.

As described above, the cooling device for the underwater datacenter according to the present invention is configured to have the seawater circulation ducts located in the underwater datacenter so that the heat exchange between the seawater and the underwater datacenter is maximized through the natural flow of the seawater.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

It should be understood that the effects of the present invention are not limited to the effects described above, and include all effects that can be inferred from the configuration of the invention described in the detailed description or claims of the present invention.

The description of the present invention described above is for illustrative purposes, and those skilled in the art may understand that it can be easily modified into other specific forms without changing the technical spirit or essential features of the present invention. Therefore, it should be understood that the embodiments described above are illustrative in all respects and not restrictive. For example, each component described as a single type may be implemented in a distributed form, and components described as distributed may also be implemented in a combined form likewise.

The scope of the present invention is indicated by the following claims, and all changes or modifications derived from the meaning and scope of the claims and their equivalents should be construed as being included in the scope of the present invention.

What is claimed is:

1. A cooling device for an underwater datacenter, which is adapted to perform heat exchange between internal devices of the underwater datacenter and seawater, the cooling device comprising:

an inlet duct disposed on one surface of the underwater datacenter and having a seawater introducing passage defined therealong, the inlet duct comprising:

a seawater introducing part having an inlet open to introduce the seawater thereinto;

an inlet duct connection part whose at least a portion comes into close contact with an outer surface of the underwater datacenter and whose bottom is open to move the seawater to a heat exchanger; and an introduction passage part connecting the seawater introducing part and the inlet duct connection part to each other and having a passage with a curved outer surface; and outlet ducts spaced apart from the inlet duct and having seawater discharging passages defined therealong, each of the outlet ducts comprising:

a seawater discharging part having an outlet open to discharge the seawater;

an outlet duct connection part whose at least a portion comes into close contact with the outer surface of the underwater datacenter and whose bottom is open to move the seawater from the heat exchanger; and a discharge passage part connecting the seawater discharging part and the outlet duct connection part to each other and having a passage with a curved outer surface, wherein the heat exchanger whose one side is connected to the inlet duct and whose another side is connected to the outlet ducts, while surrounding outer surfaces of the internal devices of the underwater datacenter.

2. The cooling device according to claim 1, wherein the inlet duct is higher in position than the outlet ducts with respect to a bottom of sea on which the underwater datacenter is installed.

3. The cooling device according to claim 1, wherein an area of the inlet is greater than an area of the outlet.

4. The cooling device according to claim 1, wherein the heat exchanger comprises a pipe line or panel disposed on the outer surfaces of the internal devices of the underwater datacenter, while allowing the seawater to flow therealong.

5. The cooling device according to claim 1, wherein the inlet duct and the outlet ducts are attachable to a plurality of positions of the outer surface of the underwater datacenter excepting an underside of the underwater datacenter disposed on a bottom of sea.

* * * * *